United States Patent [19]

Fukasawa et al.

[11] Patent Number: 5,268,532
[45] Date of Patent: Dec. 7, 1993

[54] SEMICONDUCTOR DEVICE

[75] Inventors: Hiroyuki Fukasawa, Tokyo; Haruhiko Makino, Kanagawa, both of Japan

[73] Assignee: Sony Corporation, Japan

[21] Appl. No.: 915,611

[22] Filed: Jul. 21, 1992

[30] Foreign Application Priority Data

Jul. 25, 1991 [JP] Japan .................. 3-185093

[51] Int. Cl.⁵ ............................. H01L 23/28
[52] U.S. Cl. .................. 174/52.2; 437/211; 437/219; 257/787
[58] Field of Search .......... 174/52.2, 52.4; 357/72, 357/73, 74; 257/678, 687, 690, 692, 693, 694, 701, 787; 437/209, 211, 212, 215, 216, 217, 219

[56] References Cited

U.S. PATENT DOCUMENTS

| | | |
|---|---|---|
| 4,951,119 | 8/1990 | Yonemochi et al. .......... 357/72 |
| 5,018,003 | 5/1991 | Yasunaga et al. . |
| 5,096,853 | 3/1992 | Yasunaga et al. . |

FOREIGN PATENT DOCUMENTS 0191365 7/1990 Japan .................. 357/72

*Primary Examiner*—Leo P. Picard
*Assistant Examiner*—Bot Ledynh
*Attorney, Agent, or Firm*—Ronald P. Kananen

[57] ABSTRACT

A semiconductor device including a lead frame provided with a die pad and a plurality of leads arranged around the die pad, a semiconductor element mounted on the die pad, and a molding resin for sealing the semiconductor element. A spacing defined between the die pad and the leads is sized, i.e. made very small, that a flow velocity of a first portion of the molding resin flowing in a peripheral region of the semiconductor element becomes substantially equal to a flow velocity of a second portion of the molding resin flowing on at least an upper surface of the semiconductor element. That is, the first portion of the molding resin flowing in the peripheral region of the semiconductor element receives resistance due to the very small spacing between the die pad and the leads. Accordingly, the flow of the molding resin as a whole can be made uniform to thereby reduce or eliminate the generation of voids in the molding resin. As a result, reliability and productivity of the semiconductor device can be improved.

20 Claims, 7 Drawing Sheets

(PRIOR ART)

(PRIOR ART)

(PRIOR ART)

SEMICONDUCTOR DEVICE

BACKGROUND OF THE INVENTION

The present invention relates to a semiconductor device including a lead frame provided with a die pad and a plurality of leads, a semiconductor element mounted on the die pad, and a molding resin for sealing the semiconductor element. More particularly, this invention relates to an improved construction of the lead frame.

DESCRIPTION OF THE PRIOR ART

A conventional semiconductor device will now be described with reference to FIGS. 9 to 12. FIG. 9 is a schematic plan view of a lead frame to be used in a QFJ type semiconductor device; FIG. 10 is a schematic plan view of a part of a lead frame to be used in an SOP type semiconductor device; FIG. 11 is a plan view illustrating a condition where a molding resin is let to flow over a semiconductor element mounted on the lead frame shown in FIG. 9; and FIG. 12 is a schematic enlarged cross section taken along the line X—X in FIG. 11.

Referring to FIG. 9, reference numeral 1 generally designates a lead frame of a QFJ type semiconductor device. The lead frame 1 is constituted of a die pad 2 located at a central position, a plurality of inner leads 3 arranged so as to surround the die pad 2, a plurality of outer leads 4 arranged outside the inner leads 3 so as to correspond thereto, respectively, a tie bar 5, and a frame 6.

A semiconductor element 7 is fixedly mounted on the die pad 2. Although not shown, a plurality of electrodes are formed at a peripheral portion of the semiconductor element 7. The electrodes of the semiconductor element 7 are connected through a plurality of gold wires (not shown) to inner ends 8 of the inner leads 3, respectively. The inner ends 8 of the inner leads 3 are arranged polygonally so that distances between the electrodes of the semiconductor element 7 and the inner ends 8 of the inner leads 3 corresponding to the electrodes may be equal to one another, that is, lengths of the gold wires connecting the electrodes with the corresponding inner ends 8 may be equal to one another. Accordingly, there are defined four substantially triangular spaces A between the polygonal line defined by the arrangement of the inner ends 8 and the four sides of the die pad 2. Although depending on a size of the semiconductor device, a width of each space A between a vertex portion thereof and the corresponding side of the die pad 2 is about 0.8 mm in average, and a width of each space A between each base end portion thereof and the corresponding side of the die pad 2 is about 0.4 mm in average. Further, a thickness of the QFJ semiconductor device as a whole is about 1.4 mm in average.

Referring to FIG. 10, reference numeral 11 generally designates a part of a lead frame of an SOP type semiconductor device. The lead frame 11 includes a rectangular die pad 12 and a plurality of inner leads 13 arranged on the opposite sides of the die pad 12. Inner ends 18 of the inner leads 13 are arranged along two parallel side edges of the rectangular die pad 12 so that a fixed spacing $L_1$ is defined between each side edge of the die pad 12 and the line of arrangement of the inner ends 18 on the same side. Although depending on a size of the semiconductor device, the spacing $L_1$ is about 0.8 mm in average, and a thickness of the SOP type semiconductor device as a whole is about 1.0 mm. Like the QFJ type semiconductor device mentioned above, a semiconductor element 17 is fixedly mounted on the die pad 12, and the other parts not shown are also similarly arranged.

In each of the QFJ type semiconductor device and the SOP type semiconductor device as mentioned above, the semiconductor elements 7 and 17 are sealed by a molding resin. In the case of the QFJ type semiconductor device, for example, the molding resin such as thermosetting epoxy resin is injected from a position and a direction shown by an arrow P in FIG. 9 to thereby seal the semiconductor element 7.

In recent years, it has been demanded to make such a semiconductor device as thin as possible in accordance with the tendency such that electronic equipments become very compact and very thin. Both the QFJ type semiconductor device and the SOP type semiconductor device each having a thickness of 1.0 mm or less are in practical application at present.

However, in manufacture of such a thin semiconductor device, there is a problem that voids are generated in sealing the semiconductor elements 7 and 17 on the lead frames 1 and 11 by means of a molding resin. The course of generation of the voids will be described with reference to FIG. 11. As mentioned above, a molding resin M is usually injected from a position and a direction shown by an arrow P. During flowing of the molding resin M, it is divided into rightward and leftward flows and upward and downward flows in the vicinity of the semiconductor element 7. Since the spaces A defined by the die pad 2 and the inner ends 8 of the inner leads 3 are relatively wide, a portion S of the molding resin M flowing in the spaces A is allowed to smoothly flow with less resistance because of no obstacles. Therefore, the portion S is allowed to flow remarkably faster than a portion C of the molding resin M flowing on the semiconductor element 7. Thus, the flow of the molding resin M becomes non-uniform. Thereafter, right and left leading ends $M_R$ and $M_L$ of the portion S precede a leading end $M_C$ of the portion C. As the injection of the molding resin M proceeds, both the right and left leading ends $M_R$ and $M_L$ join together. At this time, air existing in the vicinity of the right and left leading ends $M_R$ and $M_L$ is involved thereinto to generate the voids.

It is considered that this phenomenon occurs similarly in the case of the SOP type semiconductor device as shown in FIG. 10. That is, since the spacing $L_1$ defined between the die pad 12 and the inner ends 18 of the inner leads 13 is relatively wide, a portion of a molding resin flowing in a region with no obstacles corresponding to the spacing $L_1$ is allowed to flow remarkably faster than another portion of the molding resin flowing on the semiconductor element 17, thus resulting in nonuniformity of the flow of the molding resin. Accordingly, rightward and leftward divided portions of the molding resin involve thereinto air existing in the vicinity thereof, thus generating the voids.

Referring to FIG. 12 which is a schematic enlarged cross section taken along the line X—X in FIG. 11, there are shown the voids B formed by the right and left leading ends $M_R$ and $M_L$ of the portion S of the molding resin M.

The existence of the voids B in the semiconductor device causes corrosion of aluminum electrodes 19 on the semiconductor element 17, for example, to break bonding wires 20, or causes a deterioration in moisture resistance.

In testing the generation of the voids B with use of epoxy resin having a viscosity of about 350 poise, the voids B were generated in 10% of samples, while in testing with use of epoxy resin having a viscosity of about 600 poise, the voids B were generated in all of the samples.

SUMMARY OF THE INVENTION

It is accordingly an object of the present invention to prevent the generation of the voids in sealing a semiconductor element with a molding resin.

According to the present invention, there is provided in a semiconductor device including a lead frame provided with a die pad and a plurality of leads arranged around the die pad, a semiconductor element mounted on the die pad, and a molding resin for sealing the semiconductor element; the improvement wherein a spacing defined between the die pad and the leads is sized, i.e. made very small, so that a flow velocity of a first portion of the molding resin flowing in a peripheral region of the semiconductor element becomes substantially equal to a flow velocity of a second portion of the molding resin flowing on at least an upper surface of the semiconductor element.

With this construction, it is possible to increase a flow resistance of the first portion of the molding resin flowing in the peripheral region of the semiconductor element where the very small spacing is defined between the die pad and the leads. Therefore, the flow velocity of the first portion of the molding resin flowing in the peripheral region of the semiconductor element can be made substantially equal to the flow velocity of the second portion of the molding resin flowing on the upper surface of the semiconductor element and/or a flow velocity of a third portion of the molding resin flowing on a lower surface of the die pad. Accordingly, there is no possibility that the air is involved into the molding resin, thereby preventing the generation of the voids.

As mentioned above, according to the semiconductor device of the present invention, the molding resin is allowed to uniformly flow upon injection, thereby reducing or eliminating the generation of the voids. This effect is exhibited further remarkably in a mold package having a thickness of 1 mm or less. Therefore, reliability and productivity of the semiconductor device can be improved.

Other objects and features of the invention will be more fully understood from the following detailed description and appended claims when taken with the accompanying drawings.

DETAILED DESCRIPTION OF THE PREFERRED EMBODIMENTS

There will now be described some preferred embodiments of the present invention with reference to the drawings.

Figure 9:
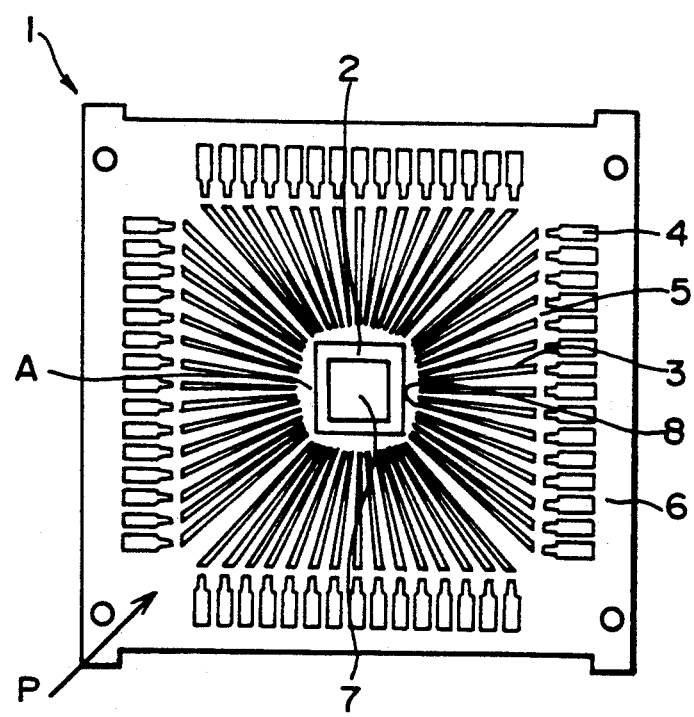
FIG. 9 is a plan view of a conventional lead frame used in a QFJ type semiconductor device.
Figure 11:
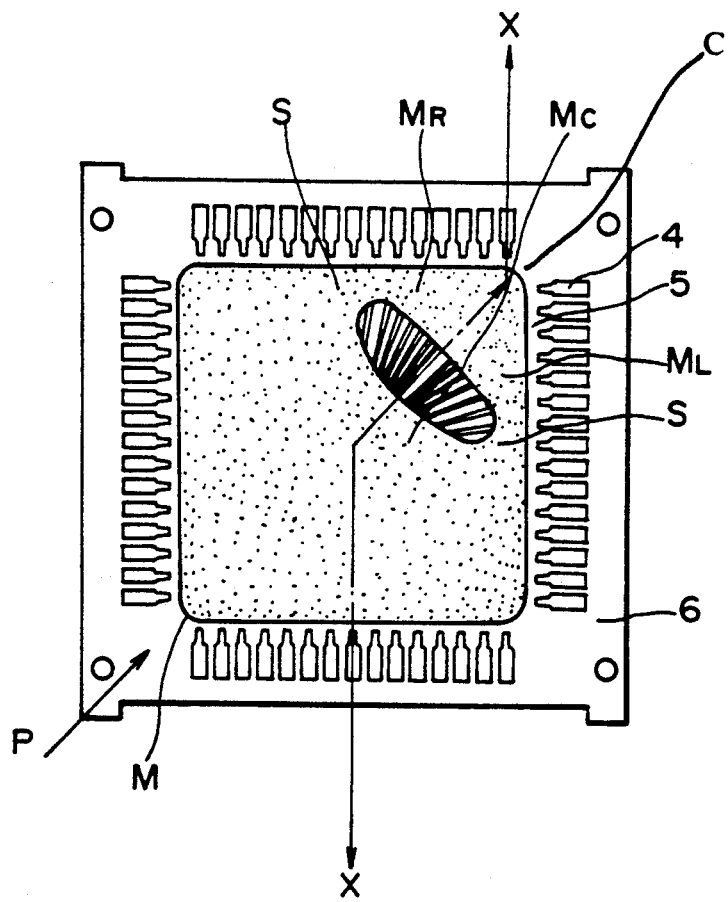
FIG. 11 is a plan view of the semiconductor device, illustrating sealing operation wherein a semiconductor element mounted on the lead frame shown in FIG. 9 is to be sealed by a molding resin.
Figure 12:
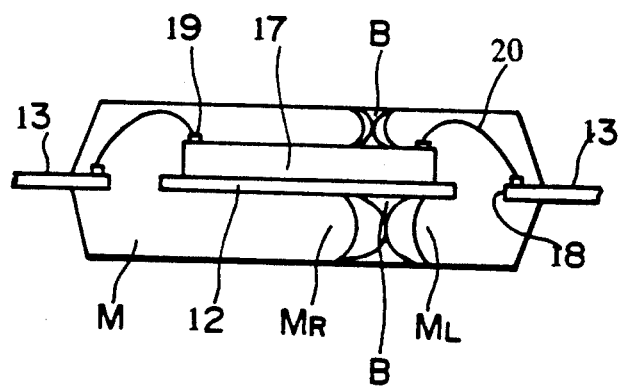
FIG. 12 is a schematic enlarged cross section taken along the line X—X in FIG. 11.

A first preferred embodiment of the present invention will first be described with reference to FIGS. 1 to 4 in which the same reference numerals as those shown in FIGS. 9, 11 and 12 designate the same parts.

Figure 1:
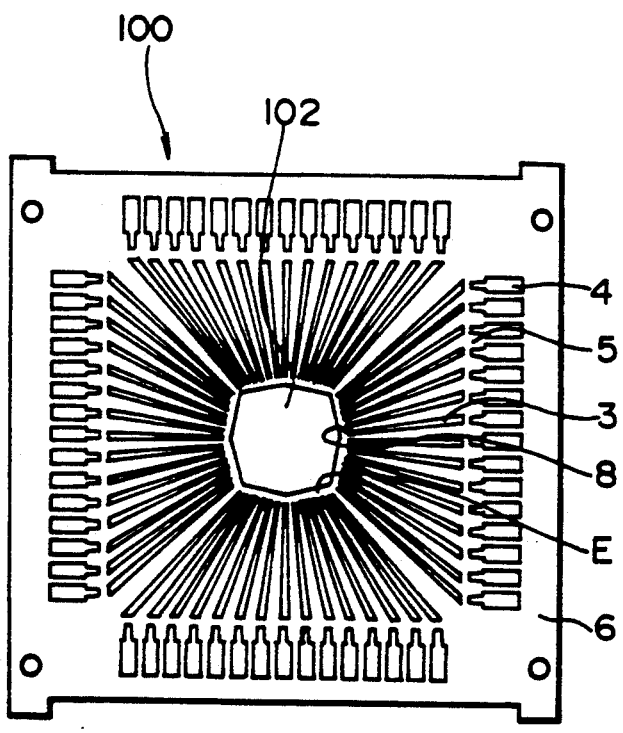
FIG. 1 is a plan view of a lead frame used in a QFJ type semiconductor device according to a preferred embodiment of the present invention.

Referring to FIG. 1, there is shown a lead frame 100 used in a QFJ type semiconductor device according to the present invention. The lead frame 100 is substantially the same in construction as the lead frame 1 shown in FIG. 9 with the exception that an outline of a die pad 102 is so shaped as to correspond to the polygonal line of arrangement of the inner ends 8 of the inner leads 3. With this construction, the relatively wide triangular spaces A in the prior art lead frame 1 shown in FIG. 9 are eliminated, and instead there is defined a space E having a uniform width between the outline of the die pad 102 and the polygonal line of arrangement of the inner ends 8 of the inner leads 3.

In a test example wherein a thickness of the mold package was 1 mm and a thickness of the lead frame 100 was 0.15 mm or less, the uniform width of the space E between the outline of the die pad 102 and the polygonal line of arrangement of the inner ends 8 of the inner leads 3 was set to about 0.5 mm or less.

Figure 2:
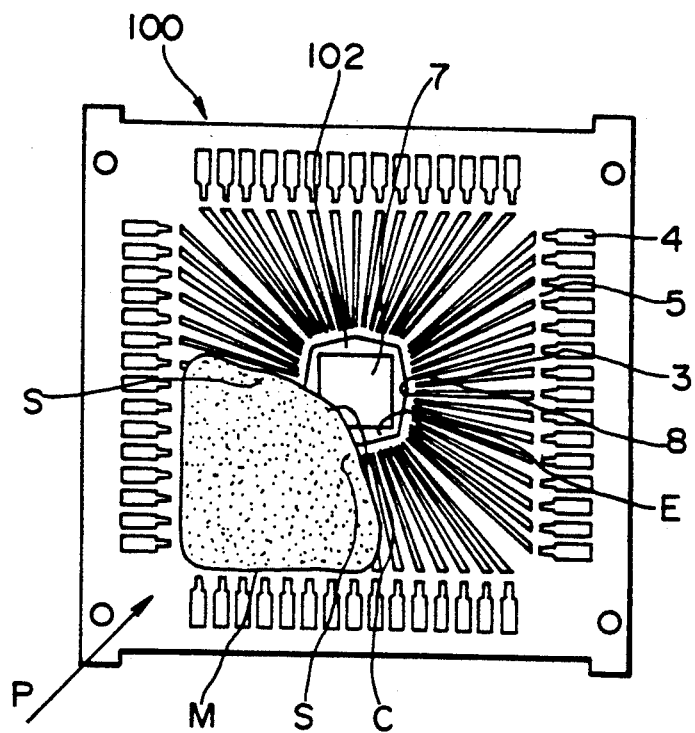
FIG. 2 is a plan view of the semiconductor device according to the present invention, illustrating an initial stage of sealing operation wherein a semiconductor element mounted on the lead frame shown in FIG. 1 is to be sealed by a molding resin.
Figure 3:
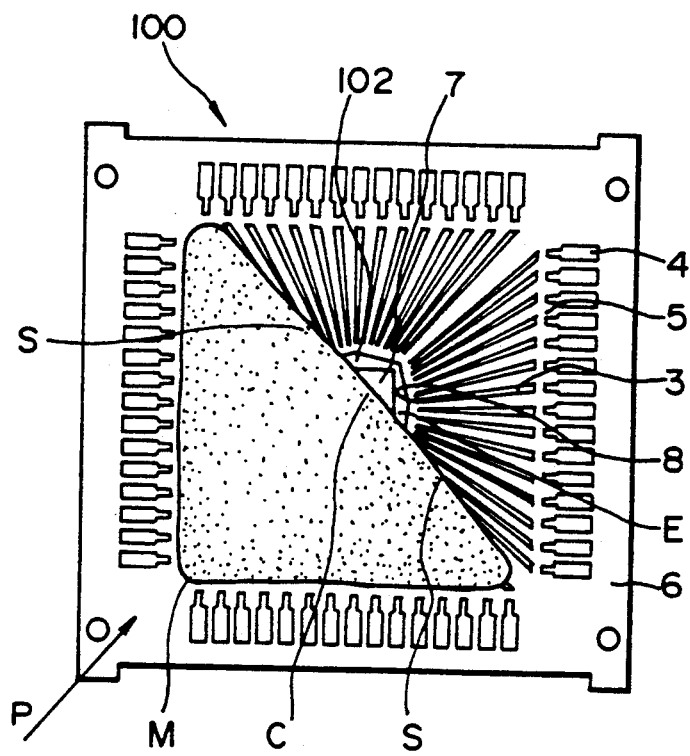
FIG. 3 is a plan view similar to FIG. 2, illustrating a middle stage of the sealing operation subsequent to the initial stage.
Figure 4:
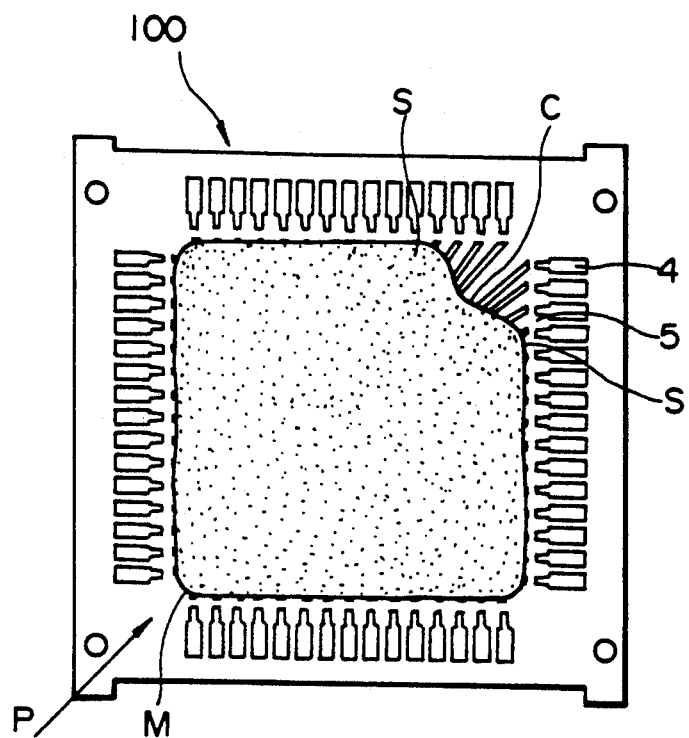
FIG. 4 is a plan view similar to FIG. 3, illustrating a final stage of the sealing operation subsequent to the middle stage.

As shown in FIG. 2, a semiconductor element 7 is mounted on the die pad 102 of the lead frame 100, and a molding resin M is injected from a position and a direction shown by an arrow P. In an initial stage of flowing of the molding resin M until it reaches the die pad 102, a portion C of the molding resin M directed to flow on an upper surface of the semiconductor element 7 precedes a portion S of the molding resin M flowing on the inner leads 3 and in the space E between the die pad 102 and the inner leads 3. In a middle stage subsequent to the initial stage as shown in FIG. 3, a flow velocity of the portion C is reduced because of resistance of the semiconductor element 7 in the same manner as in the prior art, and a flow velocity of the portion S is also reduced because of resistance of the inner ends 8 of the inner leads 3 since the space E is narrower than the spaces A in the prior art. Accordingly, the portion S is allowed to flow at substantially the same velocity as that of the portion C. In a final stage subsequent to the middle stage as shown in FIG. 4 wherein the portion C has passed over the semiconductor element 7, the portion S is allowed to flow at substantially the same velocity as that of the portion C. Therefore, the portion S does not involve thereinto the air which causes the generation of the voids.

Figure 10:
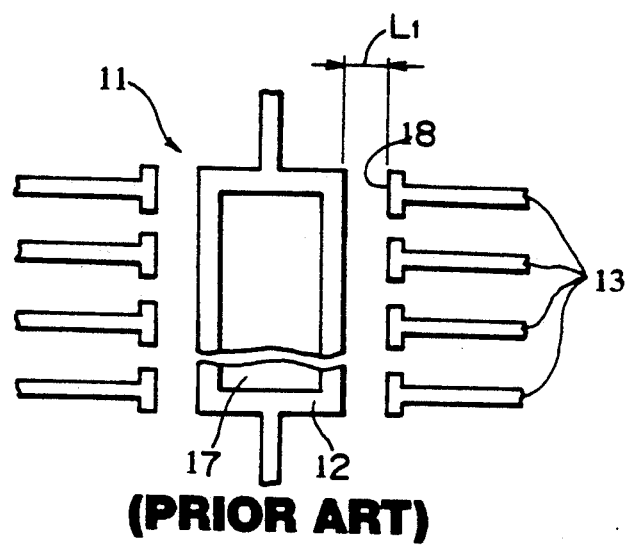
FIG. 10 is a schematic plan view of a part of a conventional lead frame used in an SOP type semiconductor device.

Next, a second preferred embodiment of the present invention will be described with reference to FIGS. 5 to 8 in which the same reference numerals as those shown in FIG. 10 designate the same parts.

Figure 5:
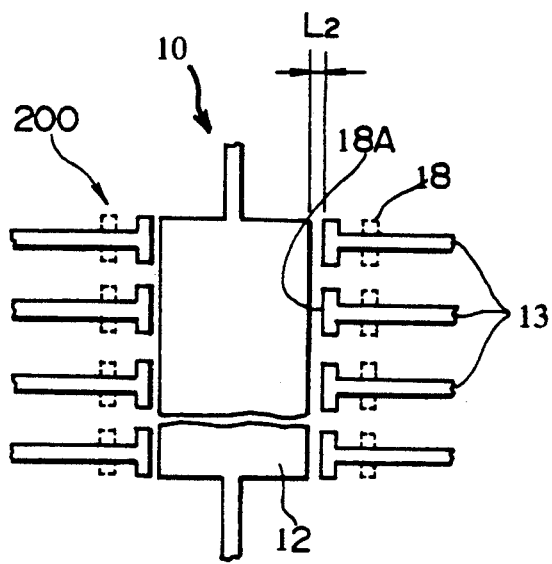
FIG. 5 is a schematic plan view of a part of a lead frame used in an SOP type semiconductor device according to another preferred embodiment of the present invention.

Referring to FIG. 5, there is shown a lead frame 200 used in an SOP type semiconductor device according to the present invention. The lead frame 200 is substantially the same in construction as the lead frame 11 shown in FIG. 10 with the exception that a spacing $L_2$ between each side edge of the die pad 12 and the line of arrangement of inner ends 18A of the inner leads 13 on the same side is narrower than the spacing $L_1$ in the prior art. For the sake of reference, the inner ends 18 of the inner leads 13 of the prior art lead frame 11 are shown by dashed lines in FIG. 5.

In a test example under the same conditions as those in the lead frame 100 of the first preferred embodiment, the spacing $L_2$ was set to 0.4 mm which is half of the spacing $L_1$ in the prior art.

Figure 6:
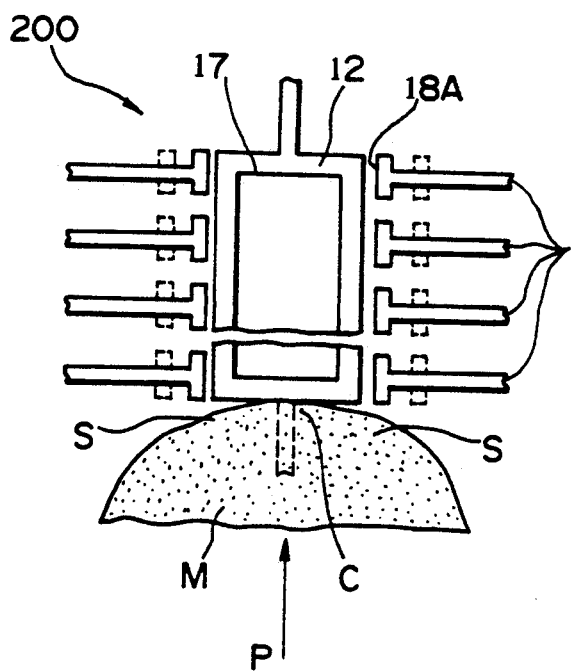
FIG. 6 is a plan view of the semiconductor device according to the present invention, illustrating an initial stage of sealing operation wherein a semiconductor element mounted on the lead frame shown in FIG. 5 is to be sealed by a molding resin.
Figure 7:
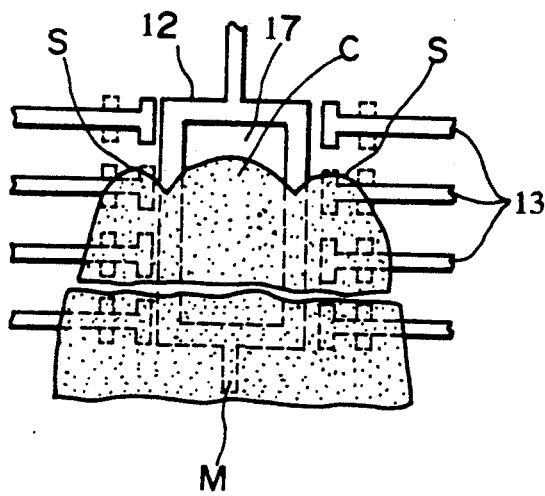
FIG. 7 is a plan view similar to FIG. 6, illustrating a middle stage of the sealing operation subsequent to the initial stage.
Figure 8:
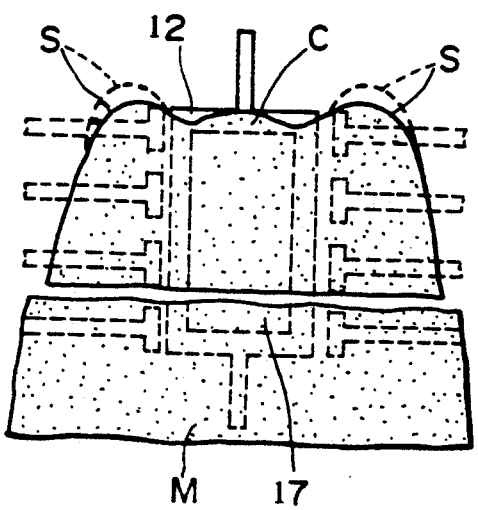
FIG. 8 is a plan view similar to FIG. 7, illustrating a final stage of the sealing operation subsequent to the middle stage.

As shown in FIG. 6, a semiconductor element 17 is mounted on the die pad 12 of the lead frame 200, and a molding resin M is injected from a position and a direction shown by an arrow P. In an initial stage of flowing of the molding resin M until it reaches the die pad 12, a portion C of the molding resin M directed to flow on an upper surface of the semiconductor element 17 precedes a portion S of the molding resin M flowing on the inner leads 13 and in the spacing $L_2$ between the die pad 12 and the inner leads 13. In a middle stage subsequent to the initial stage as shown in FIG. 7, a flow velocity of the portion C is reduced because of resistance of the semiconductor element 17 in the same manner as in the prior art, and a flow velocity of the portion S is also reduced because of resistance of the inner ends 18A of the inner leads 13 since the spacing $L_2$ is narrower than the spacing $L_1$ in the prior art. Accordingly, the portion S is allowed to flow at substantially the same velocity as that of the portion C. In a final stage subsequent to the middle stage as shown in FIG. 8 wherein the portion C has passed over the semiconductor element 17, the portion S is allowed to flow at substantially the same velocity as that of the portion C (as shown by a solid line) or at a velocity just higher than that of the portion C (as shown by a dashed line). However, the flow velocity of the portion S as shown by the dashed line is greatly lower than that in the prior art, so that the portion S does not involve thereinto the air which causes the generation of the voids.

In test examples according to the first and second preferred embodiments, epoxy resin was used for the molding resin M, and the injection of the epoxy resin was carried out with the viscosities of 350 poise and 600 poise. In both the cases, no generation of the voids was confirmed.

In FIGS. 2 to 4 and 6 to 8, a mold for injection of the molding resin M is not shown.

Although the above description of the preferred embodiments has been directed to the molding resin M flowing on the upper surface of the semiconductor element, the generation of the voids can be reduced or eliminated also in the molding resin M flowing on a lower surface of the die pad, both the upper surface of the semiconductor element and the lower surface of the die pad, or in the peripheral region of the die pad.

Further, although the semiconductor element is mounted on the flat lead frame in the above preferred embodiments, the present invention may be applied to a semiconductor device having a semiconductor element mounted by down setting. In this case, a molding resin flowing on the side opposite to the semiconductor mounting side of a lead frame receives resistance similar to that flowing on the upper surface of the semiconductor element, thereby preventing the generation of the voids.

While the invention has been described with reference to specific embodiments, the description is illustrative and is not to be construed as limiting the scope of the invention. Various modifications and changes may occur to those skilled in the art without departing from the spirit and scope of the invention as defined by the appended claims.

What is claimed is:

1. In a semiconductor device including a lead frame provided with a die pad and a plurality of leads arranged around said die pad so that inner ends of said plurality of leads are adjacent to said die pad, a semiconductor element mounted on said die pad, an upper surface of said semiconductor element exhibiting a first resistance to a flow of molding resin across said upper surface thus to cause a first flow velocity of molding resin, and a molding resin for sealing said semiconductor element; the improvement wherein a space defined between said die pad and the inner ends of said leads is sized so that a flow velocity of a first portion of said molding resin flowing in a peripheral region about said semiconductor element from a source external to said lead frame becomes substantially equal to a second flow velocity of a second portion of said molding resin flowing on at least said upper surface of said semiconductor element, said peripheral region being sized so as to present a second resistance to a flow of said molding resin through said peripheral region thus to cause said first velocity.

2. The semiconductor device as defined in claim 1, wherein an outline of said die pad is so shaped as to correspond to a line of arrangement of said inner ends of said leads so that distances between a plurality of electrodes provided on said semiconductor element and said inner ends corresponding to said electrodes are substantially equal to one another, and a spacing between said outline of said die pad and said line of arrangement of said inner ends of said leads is uniform.

3. The semiconductor device as defined in claim 2, wherein said outline of said die pad is polygonal and said line of arrangement of the inner ends of said leads is congruently polygonal and uniformly spaced therefrom.

4. The semiconductor device as defined in claim 3 wherein said uniform spacing between the outline of said die pad and said polygonal line of arrangement of the inner ends of the inner leads is about 0.5 mm or less.

5. The semiconductor device as defined in claim 2 wherein said spacing between a side edge of the die pad and the line of arrangement of the inner ends of the inner leads is less than about 0.8 mm.

6. The semiconductor device as defined in claim 5 wherein said spacing is about 0.4 mm.

7. The semiconductor device as defined in claim 1, wherein a lower surface of said die pad opposite said semiconductor element exhibits a third flow resistance to said flow of said molding resin thus causing a third flow velocity of said molding resin across said lower face so that said first flow velocity of said first portion of said molding resin flowing in said peripheral region of said semiconductor element becomes substantially equal to the third flow velocity of a third portion of said molding resin flowing on a lower surface of said die pad.

8. The semiconductor device as defined in claim 7, wherein said first flow velocity of said first portion of said molding resin flowing in said peripheral region of said semiconductor element becomes substantially equal to said second flow velocity of said second portion of said molding resin flowing on said upper surface of said semiconductor element and said third flow velocity of said third portion of said molding resin flowing on said lower surface of said die pad.

9. A semiconductor device sealed with a molding resin, comprising:
   a lead frame;
   a die pad provided on said lead frame;
   a semiconductor element mounted on said die pad, an outer surface of said semiconductor element exhibiting a first flow resistance to said molding resin when molten and flowing from a location remote from said semiconductor element across said outer surface of said semiconductor element;
   a plurality of inner leads arranged around said die pad adjacent said semiconductor element and having inner ends spaced therefrom at a distance sized to exhibit a second flow resistance to said molding resin when molten and flowing from said remote location through a space between said semiconductor element and said inner ends of said inner leads;
   said first flow resistance and said second flow resistance to said molten molding resin causing a first flow velocity and a second flow velocity respectively, which are substantially equal, when molten resin is introduced into the semiconductor device during manufacture, whereupon voids are reduced.

10. The semiconductor device as defined in claim 9, wherein an outline of said die pad is so shaped as to correspond to a line of arrangement of said inner ends of said leads so that distances between a plurality of electrodes provided on said semiconductor element and said inner ends corresponding to said electrodes is substantially equal to one another, and a spacing between said outline of said die pad and said line of arrangement of said inner ends of said leads is uniform.

11. The semiconductor device as defined in claim 10, wherein said outline of said die pad is polygonal and said line of arrangement of the inner ends of said leads is congruently polygonal and uniformly spaced therefrom.

12. The semiconductor device as defined in claim 11 wherein said uniform space between the outline of said die pad and said polygonal line of arrangement of the inner ends of the inner leads is about 0.5 mm or less.

13. The semiconductor device as defined in claim 10 wherein said spacing between a side edge of the die pad and the line of arrangement of the inner ends of the inner leads is less than about 0.8 mm.

14. The semiconductor device as defined in claim 13 wherein said spacing is about 0.4 mm.

15. The semiconductor device as defined in claim 9, wherein a lower surface of said die pad opposite said semiconductor element exhibits a third flow resistance to said flow of said molding resin thus causing a third flow velocity of said molding resin across said lower face so that a second flow velocity of said second portion of said molding resin flowing in said peripheral region of said semiconductor element becomes substantially equal to the third flow velocity of a third portion of said molding resin flowing on a lower surface of said die pad.

16. The semiconductor device as defined in claim 15, wherein said first flow velocity of said first portion of said molding resin flowing in said peripheral region of said semiconductor element becomes substantially equal to said second flow velocity of said second portion of said molding resin flowing on said upper surface of said semiconductor element and said third flow velocity of said third portion of said molding resin flowing on said lower surface of said die pad.

17. A method of making a semiconductor device sealed with a molding resin, wherein said semiconductor device comprises a lead frame; a die pad provided on said lead frame; a semiconductor element mounted on said die pad, an outer surface of said semiconductor element exhibiting a first flow resistance to said molding resin when molten and flowing from a location remote from said semiconductor element across said outer surface of said semiconductor element; a plurality of inner leads arranged around said die pad adjacent said semiconductor element and having inner ends spaced therefrom at a distance sized to exhibit a second flow resistance to said molding resin when molten and flowing from said remote location through a space between said semiconductor element and said inner ends of said inner leads; said first flow resistance and said second flow resistance to said molten molding resin causing a first flow velocity and a second flow velocity respectively, which are substantially equal, whereupon voids are reduced, said method comprising the steps of:
   providing a molten resin to said location remote from said semiconductor element;
   causing said molten resin to flow from said remote location to said die pad;
   causing a first portion of said molten resin to flow from said die pad across said surface of said semiconductor element;
   then causing a second portion of said molten resin to flow through said peripheral portion and on the inner leads;
   then causing said second portion of said molten resin to flow at substantially the same velocity as said first portion when said first portion has passed over the surface of the semiconductor element.

18. The method as set forth in claim 17, wherein said second portion is caused to flow at a velocity just higher than that of the first portion.

19. The method as set forth in claim 17 further including a step of causing said molten resin to pass over a lower surface of said die pad opposite to said surface on which said semiconductor element is located, said lower surface exhibiting a third resistance to said flow, at a third flow velocity which is about the same as said first and second flow velocities.

20. The method as set forth in claim 17 wherein said method is carried out with epoxy resin with viscosities of 350 poise and 600 poise, wherein no voids were generated.

* * * * *